United States Patent

Munroe et al.

[11] Patent Number: 6,107,180
[45] Date of Patent: *Aug. 22, 2000

[54] METHOD FOR FORMING INTERCONNECT BUMPS ON A SEMICONDUCTOR DIE

[75] Inventors: Robert A. Munroe; Stuart E. Greer, both of Austin, Tex.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 09/015,956

[22] Filed: Jan. 30, 1998

[51] Int. Cl.[7] ................................................ H01L 21/44
[52] U.S. Cl. ..................... 438/613; 438/614; 438/615; 438/616; 438/617; 29/840; 29/843
[58] Field of Search ................................ 438/613, 614, 438/615, 616, 617; 29/840, 843

[56] References Cited

U.S. PATENT DOCUMENTS

| 5,466,635 | 11/1995 | Lynch et al. | 437/183 |
| 5,470,787 | 11/1995 | Greer | 437/183 |
| 5,937,320 | 8/1999 | Andricacos et al. | 438/614 |

OTHER PUBLICATIONS

D.O.Powell et al., 1993 IEEE, "Flip–Chip on FR–4 Integrated Circuit Packaging", pp. 182–186.

T.Y.Wu, et al., 1996 Electronic Components and Technology Conference, "Materials and Mechanics Issues in Flip–chip Organic Packaging", pp. 524–534.

Flipchip Technologies, Delco/K&S Joint Venture web page with UBM description—http://www.flipchip.com/process.html, "Get bumped", pp. 1–2.

Soichi Honma, et al., "Effectiveness of Thin Film Barrier Metals for Eutectic Solder Bumps", 6 pgs.

Goran Matijasevic, et al., Copper–Tin Multilayer Composite Solder, Dept. of Electrical and Computer Engineering, University of California, Irvine, CA, pp. 264–273, IEPS Proceedings Sep. 12, 1993 San Diego CA.

Eric, Jung, et al., "The Influence of NiSn Intermetallics on the Performance of Flip Chip Contacts Using a Low–Cost Electroless Nickel Bumping Approach", 1996 Proceesings of Int'l. Electronics Pkg. Conf., International Electron Packaging Society, Edina MN, pp. 14–25..

Kevin Hussey, et al., Motorola MMTG MPU Product Analysis, Reliability and Quality Assurance, Product Analysis Report #r000047, 4 pgs.

Primary Examiner—John F. Niebling
Assistant Examiner—David A Zarneke
Attorney, Agent, or Firm—Daniel D. Hill

[57] ABSTRACT

A method of forming an interconnect bump structure (32, 33). Under Bumb Metalization 11 (UBM) comprising a chrome layer (16), a copper layer (36), and a tin layer (40) is disclosed. In one embodiment, eutectic solder (45) is then formed over the UBM (11) and reflowed in order to form the interconnect bump stucture. In another embodiment, a lead standoff (46) is formed over the UBM (11) before the formation of the eutectic solder (48).

24 Claims, 4 Drawing Sheets

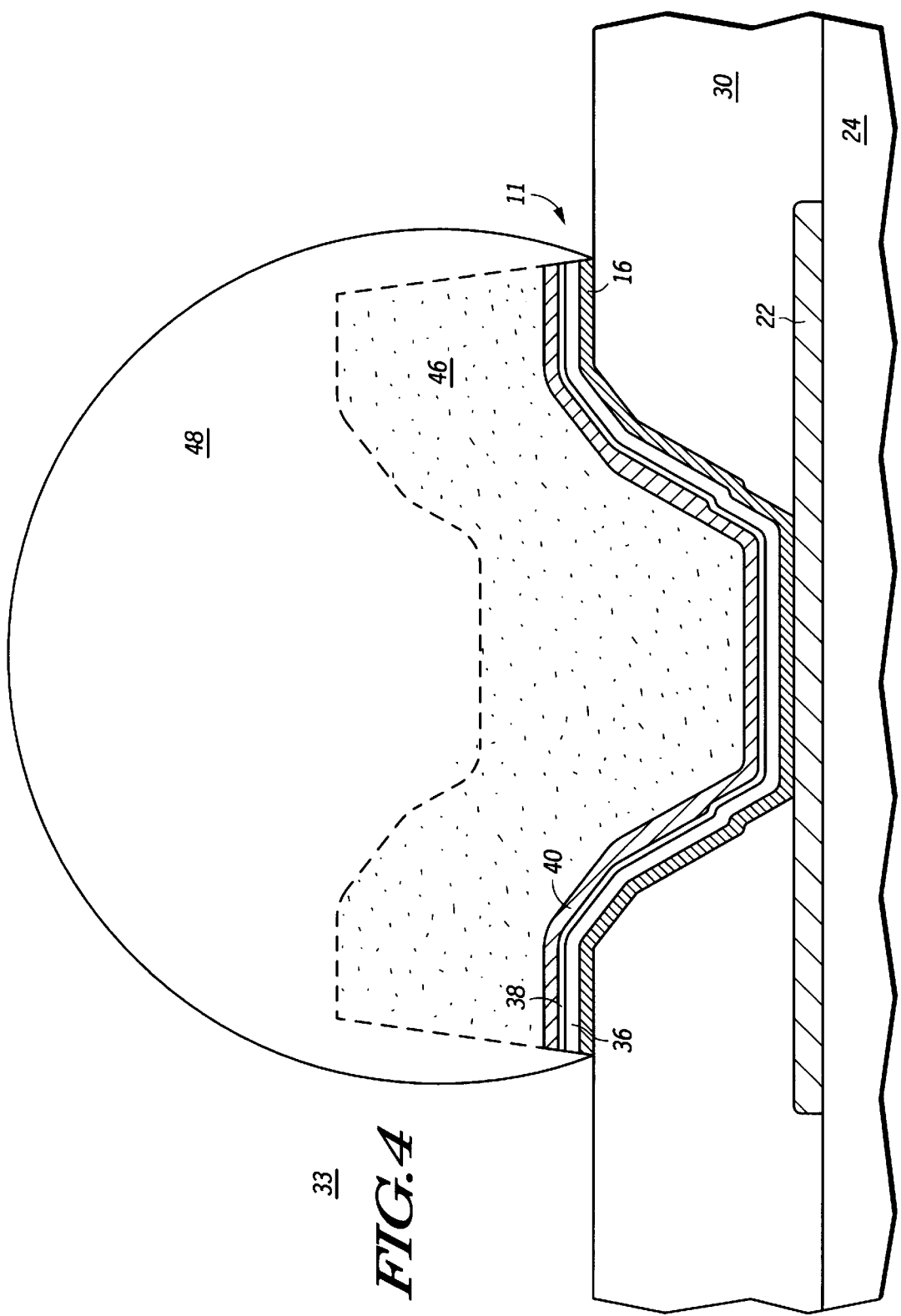

METHOD FOR FORMING INTERCONNECT BUMPS ON A SEMICONDUCTOR DIE

FIELD OF THE INVENTION

The present invention relates generally to the packaging of semiconductor devices, and specifically to formation of an interconnect bump on a semiconductor device.

BACKGROUND OF THE INVENTION

Direct Chip Attach (DCA) or flip-chip bonding is used in the semiconductor industry to connect a semiconductor die to a next level of interconnect wiring such as a ceramic chip carrier, or an organic printed circuit board. One method of DCA, known As Controlled Collapsed Chip Connection (C-4), involves depositing high lead content solder bumps on wettable bonding pads of a semiconductor die. These solder bumps are then soldered to traces or pads on the next level interconnect such as a PC board.

Before the solder bumps can be connected to the PC board, the PC board must be prepared by placing a low temperature solder, such as a eutectic tin-lead solder, on pads located on the PC board where physical and electrical connections are desired. Subsequently, the solder bumps of the device are aligned on the solder coated pads and heated such that the eutectic solder creates a connection between the device, C-4 bump, and PC board. Joining of the C-4 solder bumps directly to the PC board requires high temperatures, greater than 330° C., and PC board materials able to withstand these temperatures, such PC boards are generally too expensive for most applications.

A problem with C-4 technology in DCA applications is the use of a second low temperature solder on the PC board. Placing the eutectic solder on a printed circuit board in order to accommodate the attachment of a C-4 die requires additional time and cost. It has been estimated that the additional cost of placing the eutectic solder on a printed circuit board can cost in the range of $0.50 to $1.00 per DCA chip. This additional cost is prohibitive for some applications. Attempts have been made to overcome the costs of applying eutectic to the circuit board by placing the eutectic on the C-4 die bumps. While this eliminates the cost of applying eutectic to the circuit board, it still requires the entire C-4 process to be completed before applying the eutectic, and is an additional step in the C-4 process. Yet another disadvantage associated with the use of the C-4 structures, is the cost of forming the high lead content material by evaporation techniques. Therefore, it has been illustrated over time that the use of C-4 bump structures tend to be costly in the manufacturing environment.

Yet another long standing problem with the use of C-4 bumps is device reliability over time, especially when joined to the next level of interconnect with high tin solders. It has long been observed, that under certain conditions the under bump metalization (UBM) is attacked causing reliability issues. In extreme cases, portions of the UBM entirely lift off of the die, and into the bump itself. The result is that the high lead bump is then in direct contact with the chrome layer, which does not provide for a good intermetalic interface.

Another type of DCA utilizes an Evaporated, Extended Eutectic process (E-3). An E-3 bump structure includes a thin tin layer, or cap, formed directly atop a substantially thicker lead layer. By using the tin cap, the bump structure, when heated, forms a eutectic liquidous layer by reacting with a small portion of lead that makes up the bulk of the evaporated bump. Use of an E-3 bump eliminates the need of preparing the PC board with eutectic solder. Furthermore, use of E-3 bumps eliminates the need to reflow the solder bump prior to attachment to the next level substrate.

While the use of E-3 bump structures has overcome some disadvantages of C-4 structures, the E-3 bumps are problematic in that they are relatively soft. E-3 bumps are relatively soft because of the thick lead layer. Lead is a highly ductile element. While the ductility of lead has certain advantages, there are other instances where highly ductility is undesirable. For example, highly ductile bumps are more susceptible to deformation by physical force, such as occurs during packaging and shipping of devices. Once damaged, subsequent processing can not be guaranteed. Therefore, once an E-3 bump structure is deformed, the device needs to be discarded.

A growing field of interest in the DCA industry is the use of eutectic bumps in order to overcome the problems of the prior art. However, the use of eutectic bumps has proven to be problematic as well. One problem associated with eutectic bumps on DCA devices has to do with limitations of the organic circuit boards to which the bumped die are attached. Generally, printed circuit boards, especially in low cost applications, have wide manufacturing margins for defining pad interconnect locations. As a result of these wide tolerances, substantial amounts of copper interconnect on a PC board may be exposed as a contact site. During the attachment of a eutectic bumped die structure to such a circuit board, the wetting between the solder, associated with the bumps of the DCA die, and the copper interconnect on a PC board are such that the resulting standoff height, which is the distance from the surface of the PC board to the surface of the device, is below a dimension from which currently available underfill processes can reliably be used.

One prior art technique used to overcome the problem of minimal standoff heights, is to form of copper standoffs for the die which limit the height to a specific distance. However, problems with the use of copper standoffs also exist. One problem with the use of copper standoffs is that large copper standoffs are capable of transferring stresses into active portions of the die which result in reliability failures. Conversely, small copper standoffs can be problematic in that they react with the tin resulting in a copper standoff becoming completely reacted and therefore resulting in a less reliable connection.

Therefore, it would be useful to identify a bump structure capable of use in DCA applications that overcomes problems of the prior art.

BRIEF DESCRIPTION OF THE DRAWINGS

FIG. 4 illustrates, in cross section, a die bump of FIG. 3 having a standoff portion formed atop the under bump metallurgy.

DETAILED DESCRIPTION OF THE PREFERRED EMBODIMENT

Figure 1:
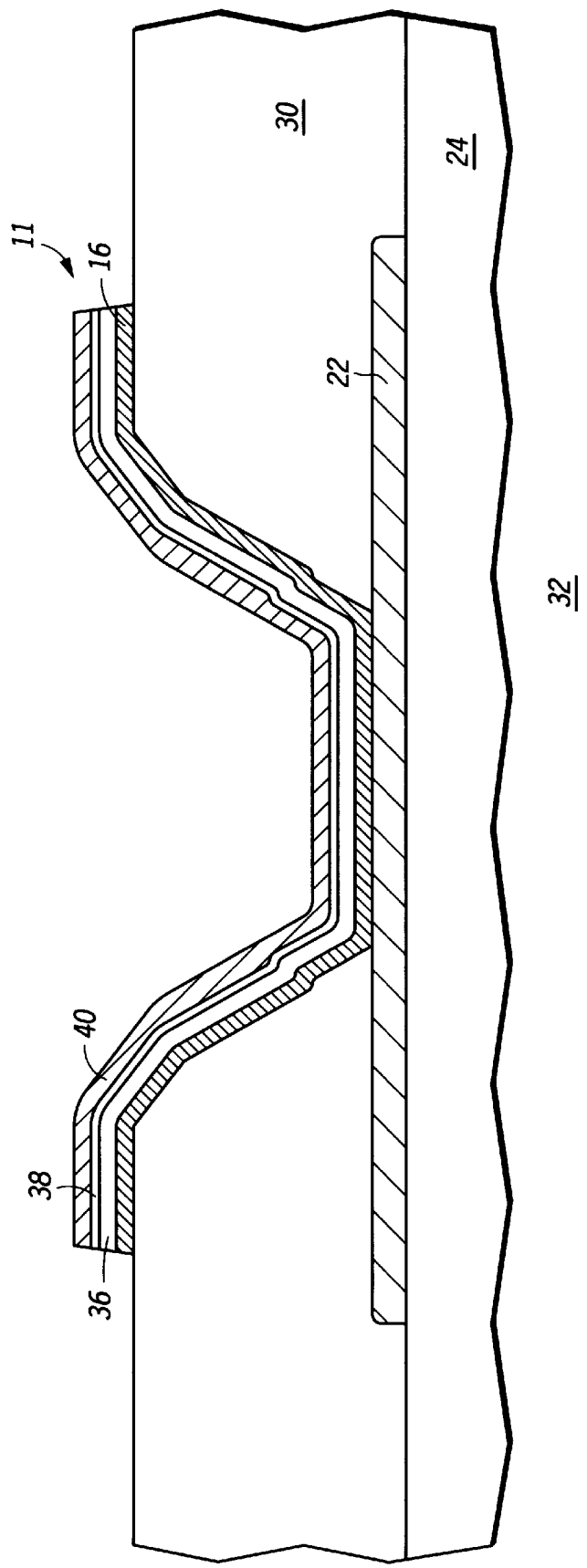
FIG. 1 illustrates, in cross section, an under bump metallurgy structure on a semiconductor device.

FIG. 1 illustrates a device 32 having a semiconductor substrate 24, a conductive interconnect 22 (also referred to as a bump pad), a passivation layer 30, and an under bump metallurgy portion 11. In one embodiment, the semiconductor substrate 24 is a monocrystalline silicon substrate. Alternatively, semiconductor substrate 24 may be a silicon-on-insulator substrate, a silicon-on-sapphire substrate, or the like.

In one embodiment, the conductive interconnect 22 is a metal bonding pad for providing the physical bond forming a connection external to the device 32. The metal pad will generally comprise aluminum or copper. Alternatively, the conductive interconnect 22 may be a composite or alloyed layer, such an aluminum-copper alloy, or aluminum with an overlying layer of titanium nitride.

The passivation layer 30, in one embodiment, can be formed by any insulative material. For example, the passivation layer can be formed using phosphorous doped glass, plasma deposited silicon oxynitride, plasma enhanced nitride, or a combination of these, or other insulative materials.

In one embodiment, the UBM 11 of device 32 includes a chrome layer 16 formed over the metal pad 22, a copper layer 36, and a tin layer 40. Additional layers may exist in the UBM 11. For example, a thin phase region may exist between the chrome layer and the copper layer, and/or a gold layer 38 can be formed over the copper in order to prevent oxidation of the copper prior to subsequent processing.

In one embodiment, the tin layer 40 is formed using an evaporative process in order to assure proper bonding of subsequent bump structures to the semiconductor device 32. In other embodiments, the tin can be formed by sputtering. Specifically, the tin layer 40 acts as a bonding agent between the copper layer 36 and subsequent layers. Generally, the tin layer 40 will have a thickness of between 1000 and 12,000 angstroms. In a specific embodiment, it has been observed by the inventor that a tin layer 40 having a thickness of 1250–1750 angstroms is sufficient to overcome the reliability issues observed in the prior art. The interaction of the tin layer 40, and its effect in improving the overall reliability of the present invention will be discussed in greater detail subsequently.

Figure 2:
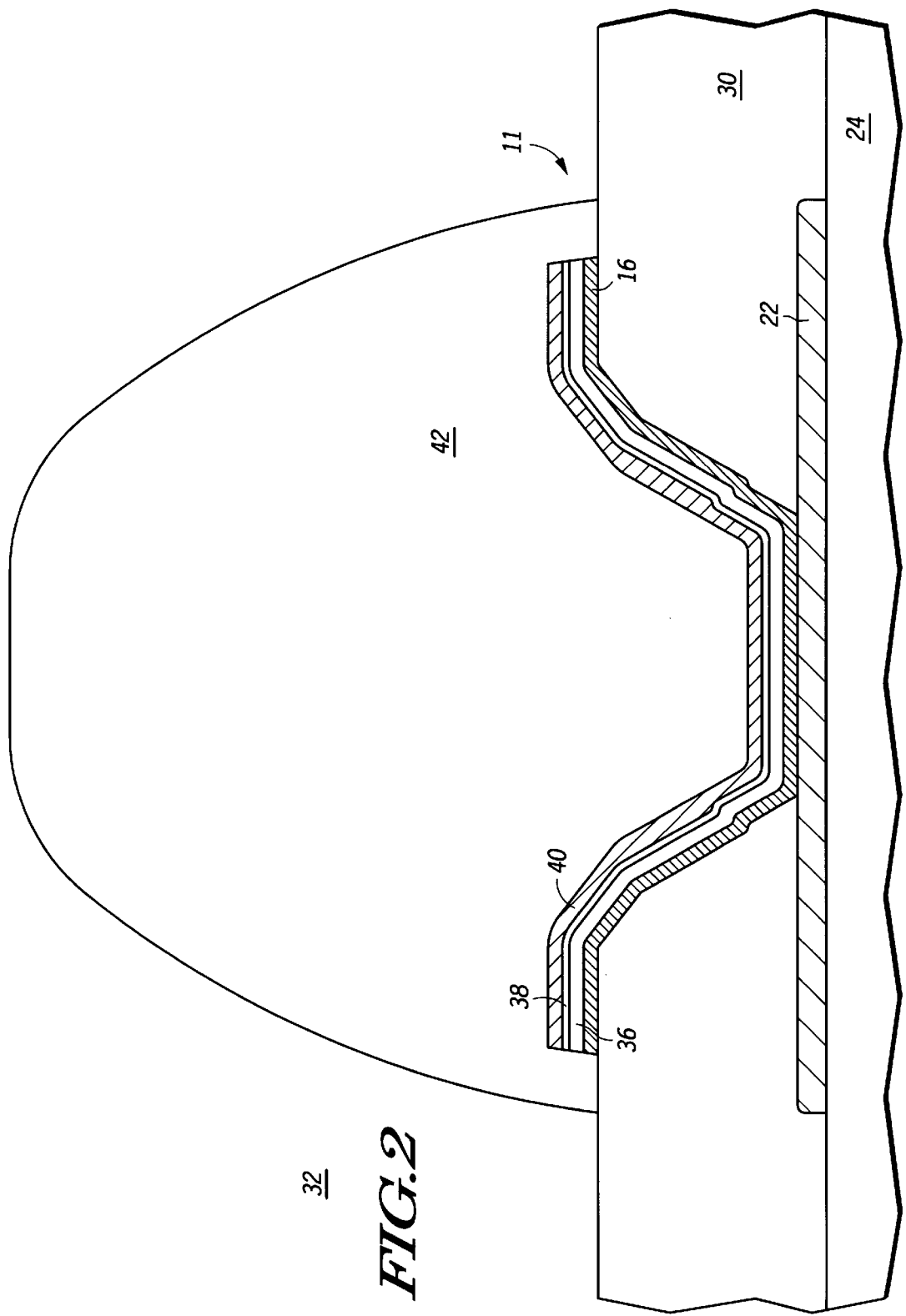
FIG. 2 illustrates, in cross section, the under bump metallurgy of FIG. 1 following the deposition of a bump material.

FIG. 2 illustrates an embodiment of the structure of FIG. 1 following the formation of a eutectic material 42 over the UBM structure 11. A eutectic material is used in order to facilitate the processing using the semiconductor die. Such processing will generally be die attachment to a printed circuit board. In one embodiment, the eutectic material would include a high tin compound. One such eutectic material is 64% tin-36% lead solder. Many other eutectic materials are known. In addition, near eutectic materials which would allow for appropriate chip attachment to a substrate are anticipated by the present invention. Generally, the solder used with this invention would be processed with peak reflow temperatures of less than 280C to allow use of economic PC board materials.

The eutectic material 42 can be formed by any of a number of methods and shapes. In the embodiment illustrated in FIG. 2, the eutectic material 42 has been applied such that it completely encompasses the UBM structure 11. By doing so, there is a greater assurance that a subsequent reflow step will cause the eutectic material 42 to wet around the edges of the structure 11. However, in other embodiments, the eutectic material 42 can be primarily deposited on top of the UBM structure 11 without entirely surrounding the UBM, wherein a subsequent reflow can still allow for appropriate wetting around the edges.

In yet another embodiment (not shown), the actual edges of the UBM structure 11 could be covered by portions of the passivation material 30. In such a structure the eutectic material 42 could be formed within the exposed boundary of the structure 11, or outside the exposed boundaries of structure 11. The eutectic material 42 can be deposited by any number of solder deposition methods. For example, solder jet deposition, printed deposition of solder using stencils or a mask, or applying a solder paste could be used. Furthermore, the actual amount of solder 42 deposited will be a function of the desired end bump size. In other words, in order to form a large solder bump, a greater amount of solder 42 material would be applied to the device than would be applied to form a small bump. Varying amounts of solder material 42 can be controlled through the use of thicker depositions, or by applying solder to larger areas.

Figure 3:
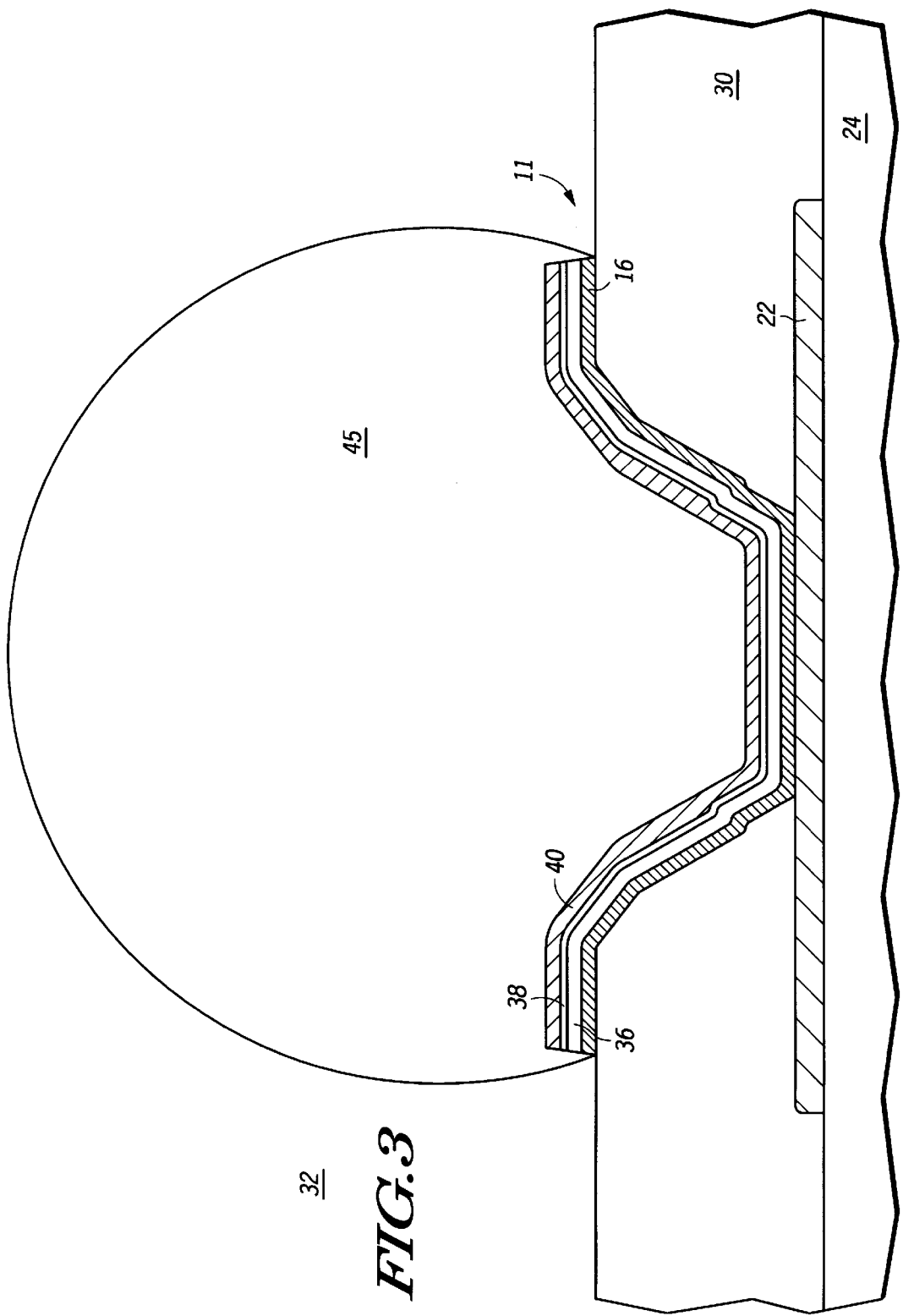
FIG. 3 illustrates, in cross section, a die bump following a reflow of the bump material of FIG. 2.

The eutectic material 42 of FIG. 2 is illustrated as solder bump 45 in FIG. 3 by following a reflow process or step. As illustrated in FIG. 3, following a reflow step, a reflowed eutectic region 45 is formed that generally encases the edges of the UBM structure 11. In addition, the reflow process allows for the eutectic region 45 to obtain a desirable shape for further mounting onto a printed circuit board substrate.

As previously referenced, the formation of tin containing bumps and eutectic solder, over a copper portion of a UBM, has resulted in long-term reliability issues. The prior art teaches that excess tin causes the reliability problems. Based upon the work and observations of the present inventor, it is now believed that the root cause of the reliability problem is not just excess tin, but uneven stresses associated with the method that the copper tin intermetallics are formed at the UBM layer. In addition the inventor has observed that when high tin solders are used in the prior art with processing temperatures in excess of 220C the UBM is attacked at a highly increased rate. This is believed to be due to the copper tin intermetallics becoming liquid at 227C when in contact with the tin. See Matijasevic et al, CopperTin Multi-layer Composite Solder.

With C-4 technology, it is believed that cracking of the tin layer of the UBM occurs due to the dynamic interaction of tin in the tin-lead bump when the tin is melted to form the C-4 bump. The tin-lead C-4 bump is deposited in a concentration of approximately 3% tin-97% lead. Following the reflow step, which forms the C-4 bump, the observed concentration in the tin-lead C-4 bump is approximately 2% tin-98% lead. The lost 1% interacts with the copper layer of the UBM. Because of the tin interacting with the copper during the bump melting, it is believed that non-uniform stressing occurs at the surface of the copper layer as the tin reacts with it. As a result of the non-equal stresses, the cracks form, thereby exposing more copper to interact with the tin. As a result, analysis shows that virtually all of the copper in a prior art C-4 bump reacts with the tin. This results in a primarily physical connection between the tin-lead bump and the chrome layer 16. This physical connection is susceptible to deterioration over time, as has been observed.

Analysis of the copper layer using the present invention, where a uniform tin layer 40 is formed prior to depositing a tin-lead solder, has demonstrated that a uniform copper layer remains following the reflow of the solder bump. However, the uniform tin layer 40 has the unexpected benefit of reacting in a manner to not cause the cracking associated with the prior art C-4 copper layer. The unexpected nature of this result is supported by Powell and Trivedi, Flip Chip on FR-4 Integrated Circuit Packaging which states that the excess available tin attacked the chip pad.

A further advantage over the prior art is that the use of eutectic region 45 reduces a device's susceptibility to physical damage as compared to an E3 type device. One reason for the reduced susceptibility is that, even if damaged, the eutectic region 45 has a propensity to reflow to its desired location during a subsequent attachment to a printed circuit board. Therefore, there is a greater tolerance for damage with eutectic material. As opposed to a E-3 structure, which has a rigid lead portion which once damaged tends to remain damaged. Since the whole bump reflows when made of solder such as the eutectic tin-lead the assembly process is more robust than when an E-3 structure is used. If high volumes of eutectic tin-lead solder are used to join C-4 bumps the result are reliability issues caused by the UBM attack as mentioned by Powell and Trivedi.

In another embodiment of FIG. 2, the layer 42 is a high lead content solder of the type used with C-4 technology. Generally, this will be 97% lead, 3% tin. In this embodiment, the structure 45 of FIG. 3 would represent the reflowed high lead content solder.

Referring to FIG. 4, an alternative embodiment to the present is illustrated. In the embodiment of FIG. 4, a standoff structure 46 is formed atop the UBM 11 prior to the formation of the eutectic portion 48. The standoff portion 46 is chosen to have higher melting point than the eutectic region 45. The standoff portion 46, during a subsequent attachment to a printed circuit board, defines the space between the semiconductor device passivation layer 30 and the printed circuit board (not shown) to which the device is being mounted. This standoff portion 46 allows for greater flexibility when determining an underfilm material to reside between the device 33 and a printed circuit board (not shown). Generally, the standoff region 46 would be formed through the use of an evaporated lead process, though any lead deposition process should suffice. In a specific embodiment, the standoff region 46 is substantially pure lead. The height of the structure 46 is dependent upon the height needed to underfill a die mounted on a PC board. Generally, a height above the passivation region of approximately 75μ would be advantageous. Subsequent to the formation of the standoff region 46 the eutectic region 48 would be deposited and subsequently reflowed in order to form the device illustrated in FIG. 4.

It should be noted, one of the advantages of the present invention is that the tin layer 40 formed over the copper layer 36 provides for a uniform tin, copper, intermetallic. As a result of the intermetallic region, the copper layer is more resistant to damage during the reflow procedure than the prior art. For example, in the C-4 prior art, the copper layer of the UBM associated with the C-4 structure has been observed to be entirely reacted with the tin during the reflow process. However, due to the uniform surface structure formed in the present invention, the copper layer of the UBM does not have the opportunity to interact with the tin of the eutectic material in an uneven manner. As a result, following reflow, there is a uniform bulk copper layer 36 that remains in existence. While a portion of the original copper interface 36 has reacted with the original tin layer 40 in order to form intermetallic copper tin compounds. In comparison, using the prior art methods as such as those associated with C-4 structures, no continuous bulk copper layer would remain following a reflow of the lead tin bump material. In addition, the remaining copper was an intermetallic form and had been reacted such that cracks and openings were formed in between individual "islands" of the copper tin intermetallics. The gaps between the copper tin intermetallics allowed for underlying chrome to be exposed to the lead bumping compound. As a result, the lead in contact with the chrome forms a connection but not necessarily a reliable electronic interconnection.

What is claimed is:

1. A method for forming conductive bumps on a semiconductor device comprising:
    providing a semiconductor die having a plurality of bump pads;
    forming a seed layer over each of the plurality of bump pads;
    forming a tin layer over the seed layer;
    depositing a eutectic layer over each of the plurality of bump pads such that the eutectic layer directly covers the tin layer; and
    reflowing the eutectic layer after depositing the eutectic layer.

2. The method of claim 1 further comprising the step of forming a copper layer over the bump pad before the step of forming the tin layer and after the step of forming the seed layer.

3. The method of claim 2 further comprising the step of forming a gold layer after the step of forming the copper layer and before the step of forming the tin layer.

4. The method of claim 1, wherein the tin layer is formed using an evaporative processes.

5. The method of claim 1, wherein the method of depositing the eutectic layer includes depositing a tin-solder eutectic material.

6. The method of claim 1, wherein the method of depositing the eutectic layer includes depositing the eutectic layer using a screen process.

7. The method of claim 1, wherein the method of depositing the eutectic layer includes depositing the eutectic layer using a platen process.

8. The method of claim 1, wherein the method of depositing the eutectic layer includes depositing the eutectic layer using a jet deposition process.

9. The method of claim 1 further comprising the step of forming a standoff layer over the conductive bump pad and before the step of depositing the eutectic layer.

10. The method of claim 9, wherein the standoff layer consists of lead.

11. The method of claim 9, wherein the standoff layer is at least laterally surrounded by the eutectic layer after reflowing.

12. The method of claim 9, wherein the standoff layer is formed after the step of depositing the tin layer.

13. A method of forming conductive bumps on a semiconductor device, the method comprising:
    providing a semiconductor device having an interconnect location;
    forming a seed layer over the interconnect location;
    forming a first layer comprising copper over the seed layer;
    forming a second layer comprising tin using an evaporative process over the first layer;
    forming a third layer comprising lead using an evaporative process, wherein the lead forms a stand-off structure;
    depositing a fourth layer comprising a eutectic material over the third layer;
    reflowing the fourth layer after depositing the fourth layer to form a eultectic bump over the interconnect location, wherein the fourth layer substantially surrounds the stand-off structure following reflow.

14. The method of claim 13, wherein the seed layer comprises chrome.

15. The method of claim 13, wherein the seed layer comprises titanium.

16. The method of claim 13, wherein the third layer acts as a standoff structure for controlling a spacing between the device and a circuit board.

17. A method of forming a semiconductor device, the method comprising:

forming a chrome layer over a conductive interconnect pad of a semiconductor die;

forming a copper layer directly over the chrome layer;

forming a tin layer over the copper layer;

depositing a high tin content tin-lead eutectic solder over the tin layer;

reflowing the high tin content tin-lead solder to form a solder ball after depositing the high tin content tin-lead eutectic solder.

18. The method of claim 17, wherein the high tin content tin-lead solder is approximately 64% tin and 36% lead.

19. A method of forming conductive bumps on a semiconductive bumps on a semiconductor device, the method comprising:

providing a semiconductor device having an interconnect location;

forming a seed layer over the interconnect location;

forming a first layer comprising copper over the seed layer;

forming a second layer comprising tin using an evaporative process over the first layer;

forming a third layer comprising lead using an evaporative process;

forming a fourth layer comprising tin;

reflowing the third and fourth layer to form a eutectic portion directly over and contacting the second layer.

20. The method of claim 19, wherein the interconnect location comprises an interconnect containing copper.

21. The method of claim 1, wherein the seed layer comprises chrome.

22. The method of claim 1, wherein the seed layer comprises titanium.

23. The method of claim 1, wherein each of the plurality of bump pads further include bump pads comprising copper.

24. The method of claim 13, wherein the interconnect location includes a copper containing interconnect.

* * * * *